United States Patent
Piirainen

(12) 
(10) Patent No.: US 6,396,878 B1
(45) Date of Patent: May 28, 2002

(54) RECEPTION METHOD AND A RECEIVER

(75) Inventor: Olli Piirainen, Oulu (FI)

(73) Assignee: Nokia Telecommunications Oy, Espoo (FI)

(*) Notice: Subject to any disclaimer, the term of this patent is extended or adjusted under 35 U.S.C. 154(b) by 0 days.

(21) Appl. No.: 09/171,881

(22) PCT Filed: Feb. 25, 1998

(86) PCT No.: PCT/FI98/00169
§ 371 (c)(1),
(2), (4) Date: Oct. 28, 1998

(87) PCT Pub. No.: WO98/38746
PCT Pub. Date: Sep. 3, 1998

(30) Foreign Application Priority Data

Feb. 28, 1997 (FI) .................................. 970889

(51) Int. Cl.⁷ ............................................. H04L 5/12
(52) U.S. Cl. ................. 375/262; 375/265; 375/341; 714/792; 714/795; 714/796
(58) Field of Search ................. 375/262, 265, 375/341; 714/792, 794, 795, 796

(56) References Cited

U.S. PATENT DOCUMENTS

| | | | |
|---|---|---|---|
| 5,349,608 A | 9/1994 | Graham et al. | |
| 5,377,133 A | 12/1994 | Riggle et al. | |
| 5,379,306 A | * 1/1995 | Noma et al. | .................. 371/43 |
| 5,406,570 A | 4/1995 | Berrou et al. | |
| 5,588,011 A | 12/1996 | Riggle | |
| 5,933,462 A | * 8/1999 | Viterbi et al. | ................ 375/341 |
| 6,282,251 B1 | * 8/2001 | Worstell | ..................... 375/341 |

FOREIGN PATENT DOCUMENTS

| | | |
|---|---|---|
| EP | 467 522 A2 | 1/1992 |
| EP | 529 909 A2 | 3/1993 |
| EP | 555 013 A3 | 8/1993 |
| EP | 606 724 A1 | 7/1994 |
| EP | 763 902 A1 | 3/1997 |
| WO | 97/21275 | 6/1997 |

OTHER PUBLICATIONS

Fettweis, et al, "High–Speed Parallel Viterbi Decoding: Algorithm and VLSI–Architecture", IEEE Communication Magazine, vol. 29 (5), 1991, pp. 46–54.

Proakis, J.G., "Digital Communications", McGraw–Hill Book Company, 1989, Chapter 4.2, pp. 232–287.

* cited by examiner

Primary Examiner—Stephen Chin
Assistant Examiner—Dac V. Ha
(74) Attorney, Agent, or Firm—Pillsbury Winthrop LLP

(57) ABSTRACT

The present invention relates to reception method and apparatus. The invention is characterized in that received symbols are function of bits which are determined by means of temporally successive trellis levels, which comprises a predetermined number of states, with a transition from each of the states to a state at the next level being performed on the basis of a received signal.

26 Claims, 3 Drawing Sheets

RECEPTION METHOD AND A RECEIVER

This application is the national phase of international application PCT/FI98/00169 filed Feb. 25, 1998 which designated the U.S.

FIELD OF THE INVENTION

The invention relates to a reception method in which received symbols are functions of bits, which are determined by means of temporally successive trellis levels A and B which comprise a predetermined number of states, a transition from each of the states to a state at the next level B being performed on the basis of a received symbol.

The invention also relates to a receiver which is arranged to determine the bits relating to a received symbol on the basis of temporally successive trellis levels A and B, which comprise a predetermined number of states, a transition from each of the states to a state at the next level B being performed on the basis of a received symbol.

BACKGROUND OF THE INVENTION

In a finite-state, discrete-time Markov process, with white noise influencing the estimates usually made concerning the conditions of a digital cellular radio system, the Viterbi algorithm provides for sequence estimation an optimum recursive algorithm, which is not, however, equally good for detecting individual bits. A received signal can be Viterbi-decoded at a base station or at a subscriber terminal of a cellular radio system. At a Viterbi block of the receiver a trellis of a message is searched for, whereby a transition metric of the received message is calculated. The Viterbi decoding is thus used for detecting the symbols corresponding to the transmitted information, the symbols representing bits or bit combinations of the transmitted message. The Viterbi algorithm is used, as known, in signal detection and decoding. The Viterbi algorithm generates an ML (Maximum Likelihood) sequence estimate from a signal and typically also makes soft decisions for channel decoding functions. The ML estimate comprises estimates of the symbol sequences that the signal comprises. The ML method is discussed in Proakis, J., G., *Digital Communications*, McGraw-Hill Book Company, 1989, chapter 4.2. and the hardware implementation of the Viterbi algorithm is discussed in a publication by Fettweis, G., Meyer, H., *High-Speed Parallel Viterbi Decoding: Algorithm and VLSI Architecture, IEEE Communications Magazine*, Vol. 29(5), 1991, which are included herein as references.

A prior art Viterbi detector sums the transition metrics between the states of each level, the transition metrics representing a probability of transition between the states, to cumulative transition metrics; compares the formed cumulative transition metrics in each state; and selects, on the basis of the transition metrics, survivor paths entering each state, requiring a correct path tracing phase for making bit decisions. This causes delay in the bit decisions and in the detection of symbols. In addition, the Viterbi detector falters, i.e. loses the correct path for the duration of several state transitions after having selected a wrong path branch even once.

SUMMARY OF THE INVENTION

An object of the present invention is thus to provide a reception method and a receiver using the method, the receiver replacing a detection based on the Viterbi algorithm without using sequence estimation. Further, the method does not include the generating of survivor paths, so correct path tracing is not performed either.

This is achieved with a method described in the preamble, characterized by forming, at more than one known state of the level B, a transition metric for a received symbol, the transition metric corresponding to a conditional probability and being used in the transition for moving from known states of the preceding level A to each said known state of the next level B, a state of a preceding level being determined as symbols in the transition metric, the symbols each having a predetermined number of symbol alternatives; by forming a cumulative transition metric by multiplying the transition metric by a cumulative metric relating to each known state of the preceding level A; by forming a cumulative metric relating to the states of the level B by summing cumulative transition metrics relating to the states of the level B over the symbol alternatives of a symbol, with a known location, determining a state of the preceding level A; and by determining the bits of the received symbols separately for each bit of a symbol, irrespective of each other, by using the cumulative transition metrics.

A method of the invention is also characterized by forming, at more than one known state of the level B, a transition metric for a received symbol, the transition metric corresponding to a conditional probability; and by forming a logarithm of the transition metric, the transition metric being used in the transition for moving from known states of the preceding level A to each said known state of the next level B, a state of a preceding level being determined as symbols in the transition metric, the symbols each having a predetermined number of symbol alternatives; by forming a logarithmic-cumulative transition metric by summing a logarithmic transition metric to a logarithmic-cumulative metric relating to each known state of the preceding level A; by forming an exponential cumulative metric by using the logarithmic-cumulative transition metric as an argument for an exponent function; and by summing the exponential cumulative metrics over the symbol alternatives of a symbol, with a known location, determining a state of the preceding level A; by forming the logarithmic-cumulative metric by generating a logarithm of the sum of the exponential-cumulative metrics; and by determining the bits of the received symbols separately for each bit of a symbol, irrespective of each other, by using the logarithmic-cumulative transition metrics.

A receiver of the invention is characterized in that the receiver comprises means for forming, in more than one state of the state B, a transition metric for a received symbol, the transition metric corresponding to a conditional probability and to a transition from known states of the preceding level B to each said state of the next level B, a state of a preceding level being determined as symbols in the transition metric, each symbol having a predetermined number of symbol alternatives; means for forming a cumulative transition metric by multiplying a transition metric by a cumulative metric relating to each known state of the preceding level A; means for forming a cumulative metric by summing the cumulative transition metrics relating to the different states of the level B over the symbol alternatives of the last symbol determining a state in the preceding level A; and the receiver is arranged to determine the bits of the received symbols separately for each bit of a symbol, irrespective of each other, by using the cumulative transition metrics formed in the means.

A receiver of the invention is also characterized in that the receiver comprises means for forming, in more than more states of the state B, a logarithmic transition metric for a received symbol, the logarithmic transition metric corresponding to a conditional probability and to a transition from known states of the preceding level B to each said state of the next level B, a state of a preceding level being determined by symbols in the transition metric, each symbol having a predetermined number of symbol alternatives; means for forming a logarithmic-cumulative transition metric by summing a logarithmic transition metric to a logarithmic-cumulative metric relating to each known state of the preceding level A; means for forming a cumulative metric by summing the cumulative transition metrics relating to the different states of the level B over the symbol alternatives of the last symbol determining a state in the preceding level A; and for forming a logarithmic-cumulative metric of the level B by generating a logarithm of the sum; and the receiver is arranged to generate the bits of the received symbols separately for each bit of a symbol, irrespective of each other, by using the logarithmic-cumulative transition metrics.

The method of the invention provides considerable advantages. Compared with prior art solutions, it enhances performance, speeds up both bit decisions and the determining of a symbol, and removes faltering typical of a prior art detection.

BRIEF DESCRIPTION OF THE DRAWINGS

In the Following the invention will be described in greater detail with reference to examples given in the attached drawings, in which.

DESCRIPTION OF PREFERRED EMBODIMENTS

Figure 1:
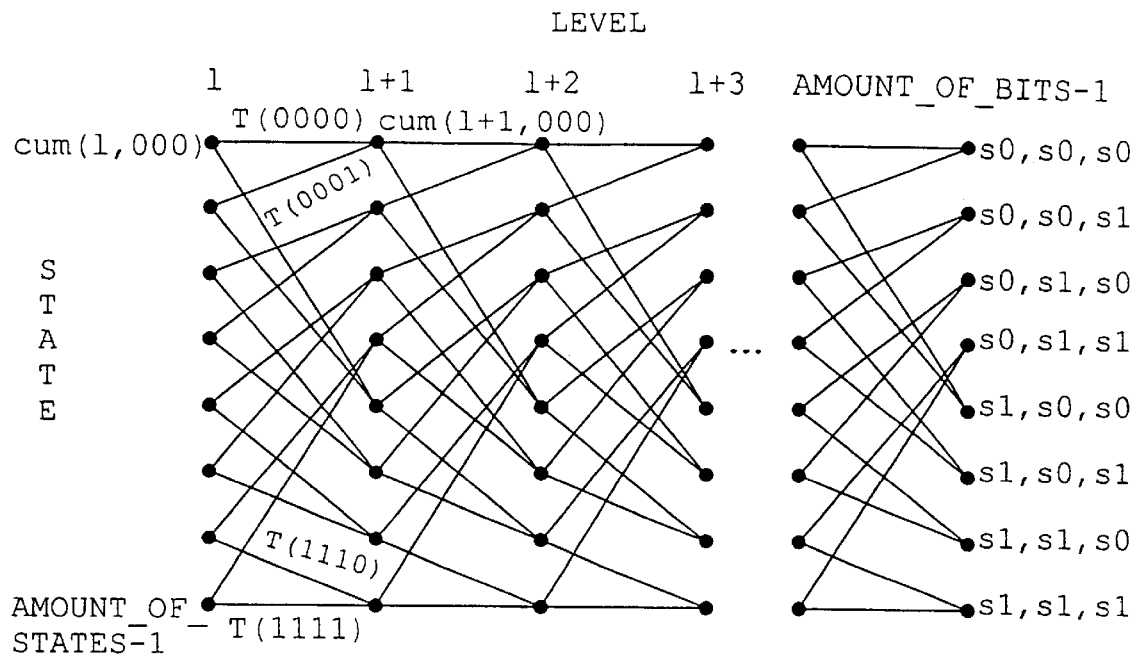
FIG. 1 illustrates a trellis diagram.

A method and a receiver of the invention can be applied to digital radio systems, particularly to a GSM system, without the invention being, however, restricted to it. Data samples y of a signal received in a radio system can be expressed as follows:

$$y = HS + n, \tag{1}$$

where H is a channel estimate, i.e. an impulse response estimate, S represents the transmitted data, n represents noise and interference. Bold type is used to show that the character concerned is a vector or a matrix. Let us first study the theoretical basis of the solution of the invention. A group B with two elements is determined. The group B is called a bit $$B = \{a_0, a_1\}, \tag{2}$$

where $a_0$ is for instance 0 and $a_1$ is for instance 1. A symbol $S_i$ can then be determined by means of sequences formed of bits x:

$$S_i = f(x_{i,N-1}, x_{i,N-2}, \ldots x_{i,0}); \ x_{i,N-1} \in B \land x_{i,N-2} \in B \land \ldots \land x_{i,0} \in B, \tag{3}$$

which means that the symbol $S_i$ is a function of the bits $x_{i,N-1}, x_{i,N-2}, \ldots X_{i,0}$. The sign $\Lambda$ in formula (3) is an AND-sign. In this expression N represents the number of the bits. The symbol $S_i$ can thus comprise $m = 2^N$ values, said values being denoted by $S_i \in A = \{(S_0, \ldots S_1, \ldots S_2^{N-1}\}$. By applying the Markov chain, the probability $p(y_i|S_i)$, or the like, which means that the received $y_i$ comprises the symbol $S_i$, can thus be written in the following form:

$$p(y_i|S_i) = p(y_i|S_i, S_{i-1}, \ldots, S_{i-r}) \ p(y_{i-1}|S_{i-1}, S_{i-2}, \ldots, S_{i-r-1}) \ldots p(y_0|S_0), \tag{4}$$

where the channel impulse response estimate is r+1 bits long and $y_i = <y_i, y_{i-1}, \ldots, y_0>$ represents the received symbols, $S_i = <S_i, S_{i-1}, \ldots, S_0>$ representing the transmitted symbols. It is assumed here that the probability concerning all symbols is of equal magnitude. It can be noted that two successive terms share one and the same symbol, so there is only $m = 2^N$ possible transitions from one state to another. The transitions can thus be drawn as a state diagram and/or a trellis diagram, in which $m^r = (2^N)^r$ states, which corresponds to the Viterbi algorithm. From each state there are m different transitions to a next state. By using a characteristic and a probability theorem of the Markov chain, a recursion can be written between the different states of the trellis:

$$p(y_i|S_i, S_{i-1}, \ldots, S_{i-r-t+1}) = \Sigma_{s_k \in A} p(y_{i-1}|S_{i-1}, S_{i-2}, \ldots S_{i-r-t} = s_k) \ p(y_i|S_i, S_{i-2}, \ldots, S_{i-r-t-sk}), \tag{5}$$

where $p(y_i|S_i, S_{i-1}, \ldots, S_{i-r-t})$ is the transition metric, $p(y_{i-1}|S_{i-1}, S_{i-2}, \ldots, S_{i-r-t} = s_k)$ is the cumulative metric of the initial state of the transition, $p(y_i|S_{i-1}, \ldots S_{i-r-t+1})$ is a cumulative metric and t is a constant to be determined. A summation over the symbol alternatives $s_k \in A$ is performed on the basis of the symbols $S_k$. In other words, the summation of bits is separately performed for the bit 0 and the bit 1. Recursion can be started from the index i=0 and it can be continued until the end of a received burst, or the like, if it has an end. Thus $p(y_i|S_i, S_{i-1}, \ldots, S_{i-r-t+1})$ comprises the cumulative probability of all paths comprising the symbols $S_i, S_{i-1}, \ldots S_{i-r-t+1}$.

The above recursive method involved determining symbol states. This is usually not enough, typically information about a soft decision concerning the transmitted bits is needed. A method for estimating a soft decision will be described below by using the above recursion. For each bit, a probability $p(x|y)$ will be estimated. A probability $P(x_{i-t,k} = a_j|y_j)$ for one bit $x_{i-r-t,k}$ can first be written in the form $$p(x_{i-r-t,k} = a_1 \mid y_j) = p(y_j \mid x_{i-r-t,k} = a_1) p(x_{i-r-t,k} = a_1) / p(y_j) = \tag{6}$$
$$\sum_{\{\langle S_i, \ldots, S_o\rangle line \ S_j \in A\Lambda \ldots \Lambda S_o \in A \Lambda x_{i,k} = a_1\}} p(y_j \mid S_j) p(S_j) / p(y_j),$$

where $k = [0, \ldots, N-1]$ and point to bit N. A likelihood ratio can now be determined $$\frac{p(x_{i-r-t,k} = a_1 \mid y_j)}{p(x_{i-r-t,k} = a_0 \mid y_j)} = \frac{\sum_{\{\langle S_i, \ldots, S_o\rangle \mid S_j \in A\Lambda \ldots \Lambda S_o \in A \Lambda x_{i-r-t,k} = a_1\}} p(y_j \mid S_j) p(S_j) / p(y_j)}{\sum_{\{\langle S_i, \ldots, S_o\rangle \mid S_j \in A\Lambda \ldots \Lambda S_o \in A \Lambda x_{i-r-t,k} = a_0\}} p(y_j \mid S_j) p(S_j) / p(y_j)} \tag{7}$$

$$\approx \frac{\sum_{\{\langle S_i, \ldots, S_o\rangle \mid S_j \in A\Lambda \ldots \Lambda S_o \in A \Lambda x_{i-r-t,k} = a_1\}} p(y_i \mid S_i) p(S_i)}{\sum_{\{\langle S_i, \ldots, S_o\rangle \mid S_j \in A\Lambda \ldots \Lambda S_o \in A \Lambda x_{i-r-t,k} = a_0\}} p(y_i \mid S_i) p(S_i)}$$

-continued $$= \frac{\sum\limits_{\{\langle S_i,\ldots,S_{i-r-t}\rangle|\ S_i\in A\wedge\ldots\wedge S_{i-r-t}\in A\wedge x_{i-r-t,k}=a_1\}} p(y_{i-1}|S_{i-1},S_{i-2},\ldots,S_{i-r-t})p(y_i|S_i,S_{i-1},S_{i-2},\ldots,S_{i-r-t})}{\sum\limits_{\{\langle S_i,\ldots,S_{i-r-t}\rangle|\ S_i\in A\wedge\ldots\wedge S_{i-r-t}\in A\wedge x_{i-r-t,k}=a_0\}} p(y_{i-1}|S_{i-1},S_{i-2},\ldots,S_{i-r-t})p(y_i|S_i,S_{i-1},S_{i-2},\ldots,S_{i-r-t})},$$

where j represents block length (or received values, which are used for decision-making). A sub-optimal assumption is made if i<j. The above shows that the bit probability $p(x_{i-r-t,k}|y_i)$ can be calculated during the formation of the symbol metrics as a sum of the transitions. It can also be noted that the probability $p(x_{i-r-t,k}|y_i)$ is optimal when i=j. By means of a parameter t selected by the user it is possible to determine the length of the decision in the trellis. In practice small values of a parameter t already provide good reliability (the value selected for the parameter t can be t=0). If the signal to be received is a continuous one, the last symbol cannot be determined, whereby it is not possible to make optimal decisions. The decision metric in question is thus determined for one bit $x_{i-r-t,k}$ in one symbol. The metric can be separately determined for all bit indices k in any one symbol, to provide thus all bit decisions.

To generate a likelihood, division is required. Division is, however, a slow operation and it can be avoided by using a logarithm $$\log\left(\frac{p(x_{i-r-t,k}=a_1|y_j)}{p(x_{i-r-t,k}=a_0|y_j)}\right) = \log\left(\sum\limits_{\{\langle S_i,\ldots,S_O\rangle|\ S_j\in A\wedge\ldots\wedge S_O\in A\wedge x_{i-r-t,k}=a_1\}} p(y_i|S_i)\right) - \log\left(\sum\limits_{\{\langle S_i,\ldots,S_O\rangle|\ S_i\in A\wedge\ldots\wedge S_O\in A\wedge x_{i-r-t,k}=a_0\}} p(y_i|S_i)\right) \quad (8)$$

Another method for estimating a symbol will be described below. Instead of a likelihood decision, or in addition to it, a probability decision can be determined. The probability of a bit can then be determined as follows:

$$p(x_{i-r-t,k}=a_1|y_i) = \frac{\sum\limits_{\{\langle S_i,\ldots,S_O\rangle|\ S_i\in AL\ldots LS_O\in AL x_{i-r-t,k}=a_0\}} p(y_i|S_i)}{\sum\limits_{\{\langle S_i,\ldots,S_O\rangle|S_i\in AL\ldots LS_O\in A\}} p(y_i|S_i)} \quad (9)$$

$$= \frac{\sum\limits_{\{\langle S_i,\ldots,S_{i-r-t}\rangle|\ S_i\in A\wedge\ldots\wedge S_{i-r-t}\in A\wedge x_{i-r-t,k}=a_1\}} p(y_{i-1}|S_{i-1},S_{i-2},\ldots,S_{i-r-t})p(y_i|S_i,S_{i-1},S_{i-2},\ldots,S_{i-r-t})}{\sum\limits_{\{\langle S_i,\ldots,S_{i-r-t}\rangle|S_i\in A\wedge\ldots\wedge S_{i-r-t}\in A\}} p(y_{i-1}|S_{i-1},S_{i-2},\ldots,S_{i-r-t})p(y_i|S_i,S_{i-1},S_{i-2},\ldots,S_{i-r-t})}$$

In the denominator the probability, or the like, is calculated for the bit 1 or 0 as is seen from the summation $\{<S_i,\ldots,S_{i-r-t}>|S_i\epsilon A\wedge\ldots\wedge S_{i-r-t}\epsilon A\}$.

In the following the inventive method is described by using bits, which simplifies the mathematics to be used.

Let us now examine a method of the invention by using the trellis diagram of FIG. 1 which comprises, by way of example, 8 states (STATE) and 8 levels (LEVEL). The example presented concerns a case in which a symbol $S_j$ comprises two values, i.e. one bit. The states can be denoted with bits, whereby 3 bits, or symbols corresponding to bits, are needed for denoting 8 states, the bits being $s_1$ and $s_0$ and they correspond to the bits $a_1$, and $a_0$ mentioned above. Levels I, I+1, . . . , AMOUNT_OF_BITS_1 comprise temporally successive states $s_0, s_0, s_0-s_1, s_1, s_1$, the transition to which takes place on the basis of received symbols, bits or bit combinations. The detection of received bits proceeds from left to right in the trellis diagram, which represents the chronological order of events taking place in the trellis. Transition can be used for proceeding from a point, i.e. state, at each level to two different states at the next level over two different paths, depending on the received bit (the bit is either 1 or 0). On the other hand, if symbols that are bit combinations are used instead of bits, $2^r$ transitions take place from each state to $2^r$ states at the next level, r representing the number of the bits that the symbol comprises in this example the impulse response estimate thus comprises four bits, so r=3. Thus, when 2-bit symbols are used, four transitions take place from one state to the next states. The use of symbols is thus equivalent to the use of bits, and all symbol-level events in the trellis can therefore always be returned to bit-level events. A state in a metric represents a window, displaying only a few bits, usually four, at a time, in an infinite bit sequence (in the present example a window comprises 3 bits, because each level only comprises 8 states). From the sequence of a few bits appearing on the window, one bit is always omitted as the metric proceeds from one level to another and at the same time a new, received bit enters the sequence at its opposite end. The omitted bit is detected.

Symbols are used to proceed in the trellis in temporally successive trellis levels A (i−r−t) and B (i−r−t+1), which comprise a predetermined number of states, according to formula (5). A received symbol $y_1$, is, however, preferably determined by means of bit decisions. Transition from each state to a state at the next level B takes place on the basis of the received symbol. A transition metric $p(y_i|S_i, S_{i-1}, \ldots, S_{i-r-t})$ corresponding to a conditional probability is formed for the received symbol $y_i$ preferably in all states of the level B, the transition metric being used for moving in the transition from known states of the preceding level A to each known state of the next level B. In the transition metric a state of the previous level A is determined as symbols $S_{i-1}, S_{1-2}, \ldots, S_{i-r-t}$, each symbol $S_k$ having a predetermined number $2^N$ of symbol alternatives $s_k$. Further, in the inventive method is formed a cumulative transition metric by multiplying the transition metric $p(y_i|S_i, S_{i-1}, S_{i-r-t})$ by a cumulative metric $p(y_{i-1}|S_{i-1}, S_{i-2}, \ldots, S_{i-r-t})$ relating to each known state of the preceding level A. A cumulative metric $p(y_i|S_i, S_{i-1}, \ldots, S_{i-r-t})$ relating to states of the level B is then formed by summing the cumulative transition metrics $p(y_{i-1}|S_{i-1}, S_{i-2}, \ldots, S^{i-r-t=s}{}_k) p(y_i|S_i, S_{i-1}, \ldots, S_{i-r-t})$ relating preferably to all states of the level B over the symbol alternatives $s_k \in A$ of a symbol, with a known location, determining a state of the previous level A. In a binary case $s_k = f(a_0, a_1)$ cumulative metrics corresponding to the bit 0 and bit 1 are formed. In this manner the symbols are used for proceeding in the trellis. Bit probabilities or likelihood are then determined separately for each bit of a symbol, irrespective of each other, by using the cumulative transition metrics $p(y_{i-1}|S_{i-1}, \ldots, S_{i-r-t}=s_k) p(y_i|S_i, S_{i-1}, \ldots, S_{i-r-t})$.

When logarithmic probabilities are used, the inventive method is to a large part similar to the previous method. A cumulative metric is formed, whereby a logarithmic-cumulative transition metric $a\hat{}[b\cdot\log(p(y_i|S_i, S_{i-1}, \ldots, S_{i-r-t})) + \log(p(y_{i-1}|S_{i-r-t})) + \log(p(y_{i-1}|S_{i-1}, S_{i-2}, \ldots, S_{i-r-t}))]$, in which the sign ^ indicates involution, is used as an argument for the exponent function. The character a here is preferably a Neper number e or 2 and b is $\mp 1$ or $\mp \ln 2$. The exponential cumulative metrics are then summed over the symbol alternatives $s_k$ of the symbol $S_k$, with a known location, determining a state of the previous level A, the summation being performed according to a clause $\Sigma_{s_k} a\hat{}[b\cdot\log(p(y_i|S_i, S_{i-1}, \ldots, S_{i-r-t=s_k})) + b\cdot\log(p(y_{i-1}|S_{i-1}, S_{i-2}, \ldots, S_{i-r-t}\times s_k))]$, where $S_k$ is assumed to be, by way of example, $S_{i-r-t}$. The logarithmic-cumulative metric is then formed by generating a logarithm from the sum $\log\{\Sigma_{s_k} a\hat{}[b\cdot\log(p(y_i|S_i, S_{i-1}, \ldots, S_{i-r-t}=s_k)) + b\cdot\log(p(y_{i-1}|S_{i-1}, S_{i-2}, \ldots, S_{i-r-t}=s_k))]\}$ of the exponential cumulative metrics. Bit probabilities or likelihood are then determined separately for each bit of a symbol, irrespective of each other, by using the cumulative transition metrics $a\hat{}[b\cdot\log(p(y_i|S_i, S_{i-1}, \ldots, S_{i-r-t}=s_k)) + \log(p(y_{i-1}|S_{i-1}, S_{i-2}, \ldots, S_{i-r-t}=s_k))]$.

The decision about whether a received bit is $x_{i-r-t}$ can thus be made when a sample $y$, has been received. It can be assumed in the processing that $t=0$ and thus it would not need to be indicated. This can be done by using the log-likelihood function according to formula (7) and (8) for the bit decisions. A bit decision is made as a logarithmic likelihood decision by summing such cumulative transition metrics $p(y_{i-1}|S_{i-1}, S_{i-2}, \ldots, S_{i-r-t=sk}) p(y_i|S_i, S_{i-2}, \ldots, S_{i-r-t=sk})$, of the states of the level B, in which a bit $x_{i-r-t}$, with a predetermined location, of the symbol (e.g. $S_{i-r-t}$), with a known location, corresponds to 1 ($x_{i-r-t}=a_1$), and by generating the following logarithm of the sum $$\log\left[\sum_{s_k \in A \wedge x_{i-r-t}=a_1} p(y_{i-1}|S_{i-1}, S_{i-2}, \ldots, S_{i-r-t}=s_k) p(y_i|S_i, S_{i-2}, \ldots, S_{i-r-t}=s_k)\right].$$

difference is, however, that in the method a logarithm $\log(p(y_i|S_i, S_{i-1}, \ldots, S_{i-r-t}))$ of a transition metric corresponding to a conditional probability is formed for the received symbol $y_i$. A logarithmic-cumulative transition metric is formed by summing the logarithmic transition metrics $\log(p(y_i|S_i, S_{i-1}, \ldots S_{i-r-t}))$ to a logarithmic-cumulative metric $\log(p(y_{i-1}|S_{i-1}, S_{i-2}, \ldots, S_{i-r-t}))$ relating to each known state of the previous level A. An exponential A similar summation is performed in the method for such cumulative transition metrics $p(y_{i-1}|S_{i-1}, S_{i-2}, \ldots, S_{i-r-t=sk}) p(y_i|S_i, S_{i-2}, \ldots, S^{i-r-}=s_k)$ of the states of the level B, in which a bit $x_{i-r-t}$, with a known location of the symbol (e.g. $S_{i-r-t}$) with a known location corresponds to 0 ($x_{i-r-t}=a_0$), and the following logarithm of the sum is generated $$\log\left[\sum_{s_k \in A \wedge x_{i-r-t}=a_1} p(y_{i-1}|S_{i-1}, S_{i-2}, \ldots, S_{i-r-t}=s_k) p(y_i|S_i, S_{i-2}, \ldots, S_{i-r-t}=s_k)\right].$$

A difference of the logarithms of the sums of the cumulative transition metrics is then formed:

$$\log\left[\sum_{s_k \in A \wedge x_{i-r-t}=a_1} p(y_{i-1}|S_{i-1}, S_{i-2}, \ldots, S_{i-r-t}=s_k) p(y_i|S_i, S_{i-2}, \ldots, S_{i-r-t}=s_k)\right] - \log\left[\sum_{s_k \in A \wedge x_{i-r-t}=a_0} p(y_{i-1}|S_{i-1}, S_{i-2}, \ldots, S_{i-r-t}=s_k) p(y_i|S_i, S_{i-2}, \ldots, S_{i-r-t}=s_k)\right],$$

said difference representing the bit likelihood. The difference between the logarithmic sums means the same as dividing the sums of the transition metrics by each other as in the formula (7) and generating a logarithm of the quotient.

When logarithmic probabilities are used, the bit decision is made as a likelihood decision in the following manner. Exponential cumulative transition metrics $a^{\wedge}[b \cdot \log(p(y_i|S_i, S_{i-1}, \ldots, S_{i-r-t}=s_k)) + b \cdot \log(p(y_{i-1}|S_{i-1}, S_{i-2}, \ldots, S^{i-r-t=s}{}_k))]$ of the states of the level B are formed. Preferably in all states of the level B are summed such exponential cumulative transition metrics $$\sum_{s_k \in A \wedge x_{i-r-t}=a_1} a^{\wedge}[b \cdot \log(p(y_i|S_i, S_{i-1}, \ldots, S_{i-r-t}=s_k)) + b \cdot \log(p(y_{i-1}|S_{i-1}, S_{i-2}, \ldots, S_{i-r-t}=s_k)],$$

in which a bit $x_{i-r-t}$, with a predetermined location of the symbol $S_k$ with a known location, corresponds to 1 ($x_{i-r-t}=a_1$), and a logarithm of the sum is generated $$\log\left\{\sum_{s_k \in A \wedge x_{i-r-t}=a_1} a^{\wedge}[b \cdot \log(p(y_i|S_i, S_{i-1}, \ldots, S_{i-r-t}=s_k)) + \right.$$

-continued $$\left. b \cdot \log(p(y_{i-1}|S_{i-1}, S_{i-2}, \ldots, S_{i-r-t}=s_k)]\right\},$$

the logarithm providing a logarithm of the sums of the cumulative transition metrics. A corresponding summation is made of such exponential cumulative transition metrics $$\sum_{s_k \in A \wedge x_{i-r-t}=a_0} a^{\wedge}[b \cdot \log(p(y_i|S_i, S_{i-1}, \ldots, S_{i-r-t}=s_k)) + b \cdot \log(p(y_{i-1}|S_{i-1}, S_{i-2}, \ldots, S_{i-r-t}=s_k))],$$

of the states of the level B in which a bit $x_{i-r-t}$, with a predetermined location, of the predetermined symbol $S_k$ corresponds to 0, and a logarithm of the sum is generated $$\sum_{s_k \in A | x_{i-r-t}=a_0} \log\{\sum a^{\wedge}[b \cdot \log(p(y_i|S_i, S_{i-1}, \ldots, S_{i-r-t}=s_k)) + b \cdot \log(p(y_{i-1}|S_{i-1}, S_{i-2}, \ldots, S_{i-r-t}=s_k))]\},$$

thereby providing a logarithm of the sums of the cumulative transition metrics. A difference of the logarithms of the sums of the cumulative transition metrics is then formed $$\sum_{s_k \in A \wedge x_{i-r-t}=a_0} a^{\wedge}[b \cdot \log(p(y_i|S_i, S_{i-1}, \ldots, S_{i-r-t}=s_k)) + b \cdot \log(p(y_{i-1}|S_{i-1}, S_{i-2}, \ldots, S_{i-r-t}=s_k))] - \sum_{s_k \in A | x_{i-r-t}=a_0} \log\{\sum a^{\wedge}[b \cdot \log(p(y_i|S_i, S_{i-1}, \ldots, S_{i-r-t}=s_k)) + b \cdot \log(p(y_{i-1}|S_{i-1}, S_{i-2}, \ldots, S_{i-r-t}=s_k))]\},$$

the difference representing the bit likelihood.

Correspondingly, a probability concerning a bit decision is generated similarly as a likelihood decision. The denominator in the formula (9) is the-same, the only difference being that the denominator in the formula (9) is a probability $$\sum_{\{<S_i, \ldots, S_{i-r-t}>|S_i \in A \wedge \ldots \wedge S_{i-r-t} \in A\}} p(y_{i-1}|S_{i-1}, S_{i-2}, \ldots, S_{i-r-t}=s_k) p(y_i|S_i, S_{i-1}, \ldots, S_{i-r-t}=s_k)$$

that the bit $x_{i-r-t}$, with a known location of the symbol $S_{i-r-t}$, with a known location corresponds to 1 or 0. Thus for instance the probability of the bit $x_{i-r-t}$ corresponding to 1 ($x_{i-r-t}=a_1$) provides the following difference $$\log\left[\sum_{s_k \in A \wedge x_{i-r-t}=a_1} p(y_{i-1}|S_{i-1}, S_{i-2}, \ldots, S_{i-r-t}=s_k) p(y_i|S_i, S_{i-2}, \ldots, S_{i-r-t}=s_k)\right] - \log\left[\sum_{s_1 \in A} p(y_{i-1}|S_{i-1}, S_{i-2}, \ldots, S_{i-r-t}=s_k) p(y_i|S_i, S_{i-2}, \ldots, S_{i-r-t}=s_k)\right].$$

Other probabilities are formed in a corresponding manner known to a person skilled in the art.

Let us now examine a simple example of a state diagram illustrated by using a trellis. A symbol in this example has only two values, so it can also be presented as bits. The successive levels A and B are now levels I and I+1. In a situation according to FIG. 1, a cumulative metric cum(I, 001) of the previous trellis events is cumulated to a state $s_0$, $s_0$, $s_0$ of the state 1. At a state $s_0$, $s_0$, $s_1$ of the level I the cumulative metric is cum(I,001). From the state $s_0$, $s_0$, $s_0$ begins a transition the transition metrics of which is denoted by T(0000), which means that the bit to be omitted is 0 and transition to the state $s_0$, $s_0$, $s_0$ takes place. Transition T(0001) from the state $s_0$, $s_0$, $s_1$ means that the bit to be omitted is 1 and transition to the state $s_0$, $s_0$, $s_0$ of the level I+1 takes place. Correspondingly, transition T(1110) is used when moving from a state $s_1$, $s_1$, $s_0$ of the level I to a state $s_1$, $s_1$, $s_1$ of the level I+1, the bit to be omitted then being 0. Similarly, a transition T(1111) is used for moving from the state $s_1$, $s_1$, $s_1$, of the level I to the state $s_1$, $s_1$, $s_1$ of the level, the bit to be omitted then being 1.

Both when logarithmic transitions and non-logarithmic transitions are used in connection with the forming of a transition metric, the impact of interference I is taken into account, preferably by generating a variance or a variance-type result of the received signal samples. The interference represents noise and interference.

In the inventive method the metrics used in the detection is controlled when an impulse response estimate is available.

The operation is performed by generating preferably hard bit decisions of the received symbols and by generating symbols of the hard bit decisions. A convolution of the impulse response and the generated symbols is used for generating reference samples. By comparing the reference samples to corresponding received samples by applying the least square sum method, the metrics to be used in the detection can then be controlled by using the result of the least square sum obtained by the comparison of the reference samples and the received samples, the result being advantageously a new impulse response estimate $\hat{H}$. The metric is then controlled by changing the impulse response estimate $\hat{H}$ towards a gradient representing change in the least square method. The magnitude of the change of the impulse response estimate $\hat{H}$ is preferably controlled in the following way:

res_vec=create_symbol|{hard([out$_k$, . . . , out$_{k-r}$])};

dist=y$_k$−$\hat{H}$*res_vec;

$\hat{H}$=$\hat{H}$+mu*dist*res_vec; (10)

where create_symbol generates symbols from hard bit decisions, hard generates hard bit decisions from bit likelihood or probability, res_vec is a symbol vector, $Y_k$ is a symbol vector of a received signal, $\hat{H}$ is an impulse response estimate vector, dist is a difference vector of the signal samples and the reference samples, $\hat{H}$*res_vec is a reference symbol vector and mu=[0, 1] acts as a weighting coefficient of a change towards the gradient. If the mu is 0, the impulse response estimate is not changed. On the basis of a simulation, a good value for the parameter mu is for instance 1/128.

The number that can most advantageously be used as a radix of the logarithm function of the sums of the numbers representing transition metric probability is 2, instead of the Neper number e, because the use of the radix 2 facilitates floating point number operations in a binary number system.

When received bits are used for making hard bit decisions, a convolution of the hard bit decisions and the impulse response are used for generating reference samples. A convolution is generally calculated from an impulse response $\hat{H}$ and estimates $\hat{S}$ estimated for instance on the basis of the following formula (11)

($\hat{H}$*$\hat{S}$)$_j$=Σ$\hat{H}_j$·$\hat{S}_{i-j}$, (11)

where i and j are elements denoting indices. The reference samples are then compared with temporally corresponding received samples by applying the least square sum method shown in formula (12)

LS=Σ|y−$\hat{H}$*$\hat{S}$|$^2$, (12)

where LS is the result of the least square sum. The result LS obtained by the comparison of the reference samples and the received samples is used for controlling the metric to be used in the Viterbi detection by changing the impulse response $\hat{H}$.

Let us now study in greater detail a receiver of the invention that functions according to the method of the invention. A receiver according to FIG. 2 comprises means 201 for forming a transition metric, means 202 for forming a cumulative metrics and means 203 for forming a cumulative transition metric. The receiver also advantageously comprises means 204 and 205 for summing, means 206 for generating a logarithm, means 207 for generating a difference, a memory 208. The receiver further comprises means 209 for summing cumulative transition metrics relating to the bit 0 or 1 and means 210 for generating a logarithm, means 211 for generating a difference, a memory 212. The receiver comprises means 213 for summing the cumulative transition metrics relating to the bit 0 or 1 and means 214 for generating a logarithm, means 215 for generating a difference and a memory 216. To control the metrics, the receiver advantageously also comprises means 217 for generating hard bit decisions, LMS means 218 and delay means 219. The operation of the receiver is advantageously controlled by control means 220.

Figure 2:
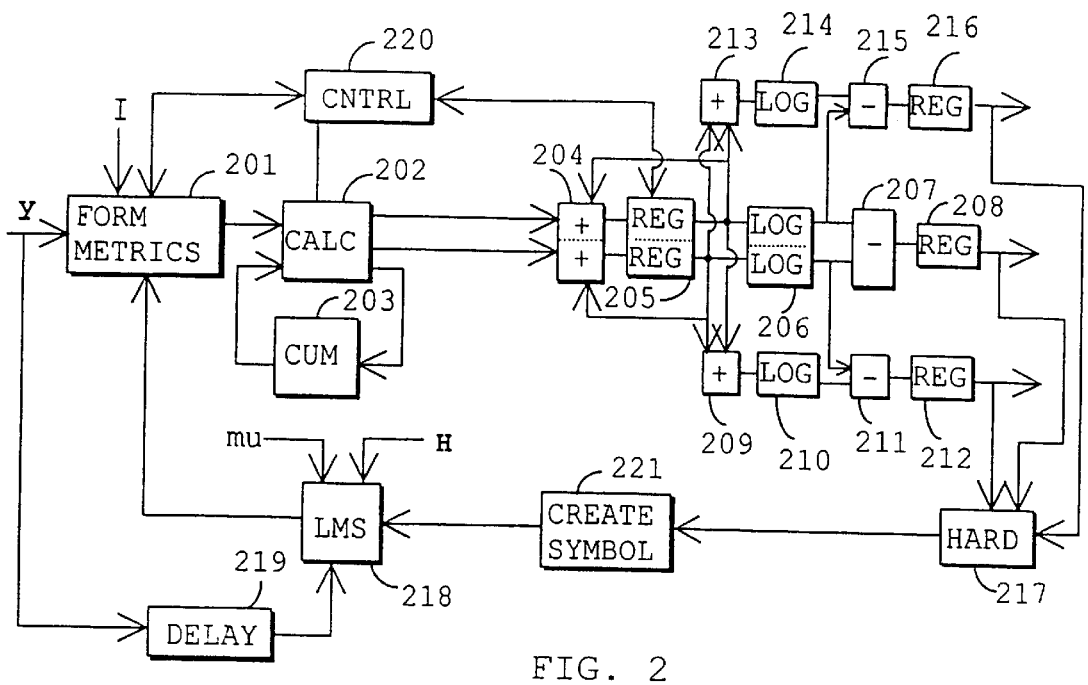
FIG. 2 illustrates a block diagram of a receiver.

Let us now study the operation of the receiver in a receiver according to FIG. 2. A sample $y_i$ of a received signal arrives at the means 201, the sample being used for generating a probability, i.e. a value p($y_i$|$S_{i-1}$, $S_{i-2}$, . . . , $S_{i-r-t}$=$s_k$), which denotes the probability and which also represents the transition metric of the current state. Means 203 are used for forming cumulative transition metrics p($y_{i-1}$|$S_{i-1}$, $S_{i-2}$, . . . , $S_{i-r-t}$=$s_k$) p($y_i$|$S_i$, $S_{i-1}$, . . . , $S_{i-r-t}$=$s_k$) by multiplying previous cumulative metrics p($y_{i-1}$|$S_{i-1}$, $S_{i-2}$, . . . , $S_{i-r-t}$=$s_k$), stored in the means 203, by the probability p($y_i$|$S_i$, $S_{i-1}$, . . . , $S_{i-r-t}$=$s_k$). A cumulative metric is formed in the means 203 by summing the cumulative transition metrics p($y_{i-1}$|$S_{i-1}$, $S_{i-2}$, . . . , $S_{i-r-t}$=$s_k$) p($y_i$|$S_i$, $S_{i-1}$, . . . , $S^{i-r-t}$=$s_k$) on the basis of the symbols $s_k$. The cumulative transition metrics p($y_{i-1}$|$S_{i-1}$, $S_{i-2}$, . . . , $S^{i-r-t}$=$s_k$) p($y_i$|$S_i$, $S_{i-1}$, . . . , $S_{i-r-t}$=$s_k$) are used for forming bit likelihood and/or probability according to the method of the invention.

Logarithmic likelihood of the bits in the received sample is generated in the receiver advantageously in the following manner. In the means 204 and 205 are summed a plural number of cumulative transition metrics, their number being preferably equal to the number of all states at each level, p($y_{i-1}$|$S_{i-1}$, $S_{i-2}$, . . . , $S_{i-r-t}$=$s_k$) p($y_i$|$S_i$, $S_{i-1}$, . . . , $S_{i-r-t}$=$s_k$), in which a bit $x_{i-r-t}$, with a predetermined location, of the symbol $S_k$=$S_{i-r-t}$, with a known location, is 0-bit. The symbol $S_{i-r-t}$ is advantageously the last symbol in a sequence determining a state and the bit is the last bit in the symbol. The 1-bit is also summed correspondingly. The means 205 is a memory register and the means 204 is a summation means. From the sum of the transition metrics of all the states of a level is advantageously generated a logarithm in the means 206 and a difference of the logarithms of the sums is generated in the means 207. The result thus obtained, i.e. a log-likelihood decision of the received symbol $y_i$, is advantageously stored into the register 208.

Instead of a likelihood decision, or in addition to it, a probability of the bit decisions concerning the received sample $y_i$, can be generated in the receiver. The means 213 and 209 in FIG. 2 advantageously sum such cumulative transition metrics of all the states of each level in which a bit with a predetermined location of the symbol with a known location is 0 or 1. In the means 214 and 210 is generated a logarithm of the sums concerned, from which is then subtracted, in the means 215 and 211, a logarithm, generated in the means 206, of the sum of the cumulative transition metrics relating to the bit 1 and bit 0. The probability relating to the bit 1 of the bit decision of the symbol is stored into the register 216 and the probability relating to the bit 0 into the register 212. The receiver comprises, at least in principle, a plural number of entities of the means 204 to 217, their number being advantageously equal to the number of bits needed in symbol coding. The physical number of the means 204 to 217 can be reduced for instance by means of serial processing.

To enhance the operation of the receiver, the impulse response estimate needed in the metric can be made adaptive. The means 217 of the receiver then make hard bit decisions concerning the bit likelihood, coming from the means 208, and/or probability, coming from at least one of the means 212 and 216. Means 221 are used for generating symbols from the hard bit decisions. A convolution of the generated symbols and the impulse response estimate is used for generating reference samples, i.e. reference symbols, in the means 218, the samples being compared with the received symbols, i.e. the samples $y_i$. By means of the differences between the received samples and the reference samples, the impulse response estimate is changed to better correspond to reality and thus to produce a better bit decision. The changed impulse response $\hat{H}$ is fed to the means 201 in which it is used for forming the metric.

Figure 3:
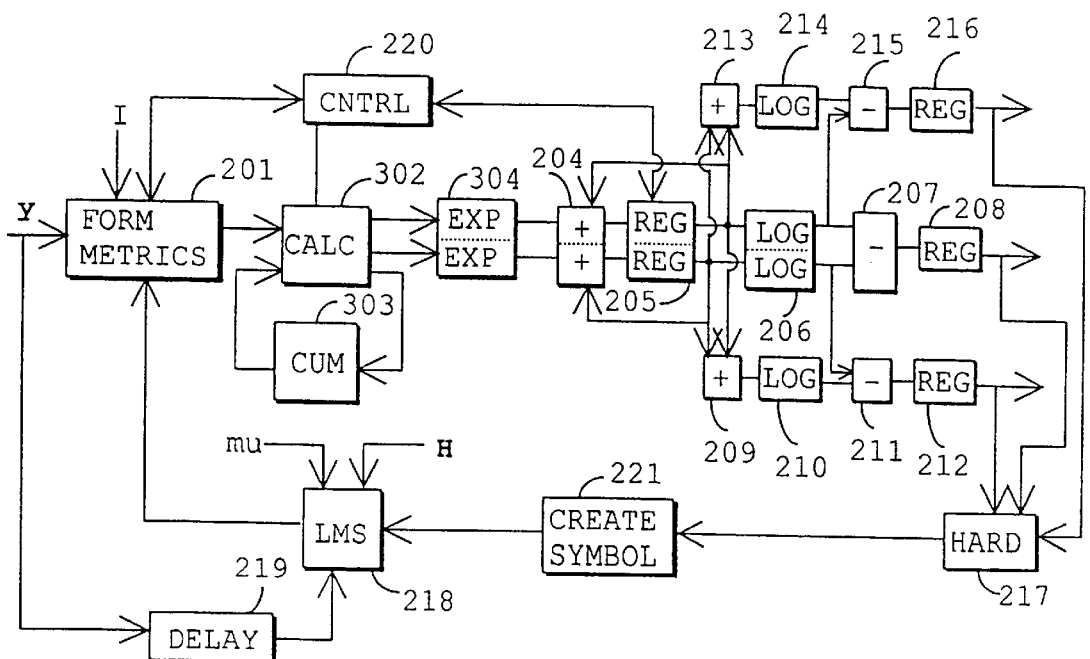
FIG. 3 illustrates a block diagram of a receiver.

The receiver according to FIG. 3 comprises the means 201 for forming a transition metric, means 302 for forming a cumulative transition metric and means 303 for forming a cumulative metric. In addition, the receiver advantageously comprises means 304 for generating an exponent function. In other respects the receiver is similar to the receiver in FIG. 2. The receiver comprises, at least in principle, a plural number of entities of the means 304 and 204 to 217, their number being advantageously equal to the number of bits needed for symbol coding. The physical number of the means 304 and 204 to 217 can be reduced for instance by means of serial processing.

Figure 4:
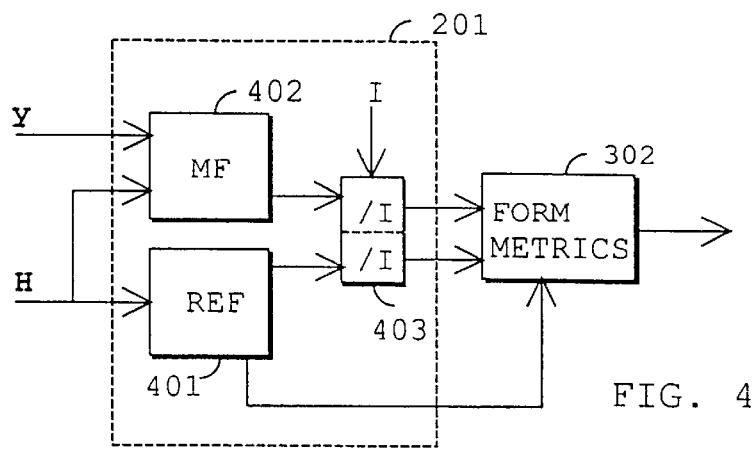
FIG. 4 illustrates means for forming a metric.

FIG. 4 illustrates in greater detail the structure of the means 201 when Ungerboeck metrics is applied. The means 201 for forming the metrics comprises means 401 for generating reference values, a matched filter 402 and means 403 for taking interference into account. The means 403 divide the output of both the matched filter 402 and the means 401 by a signal variance I.

Figure 5:
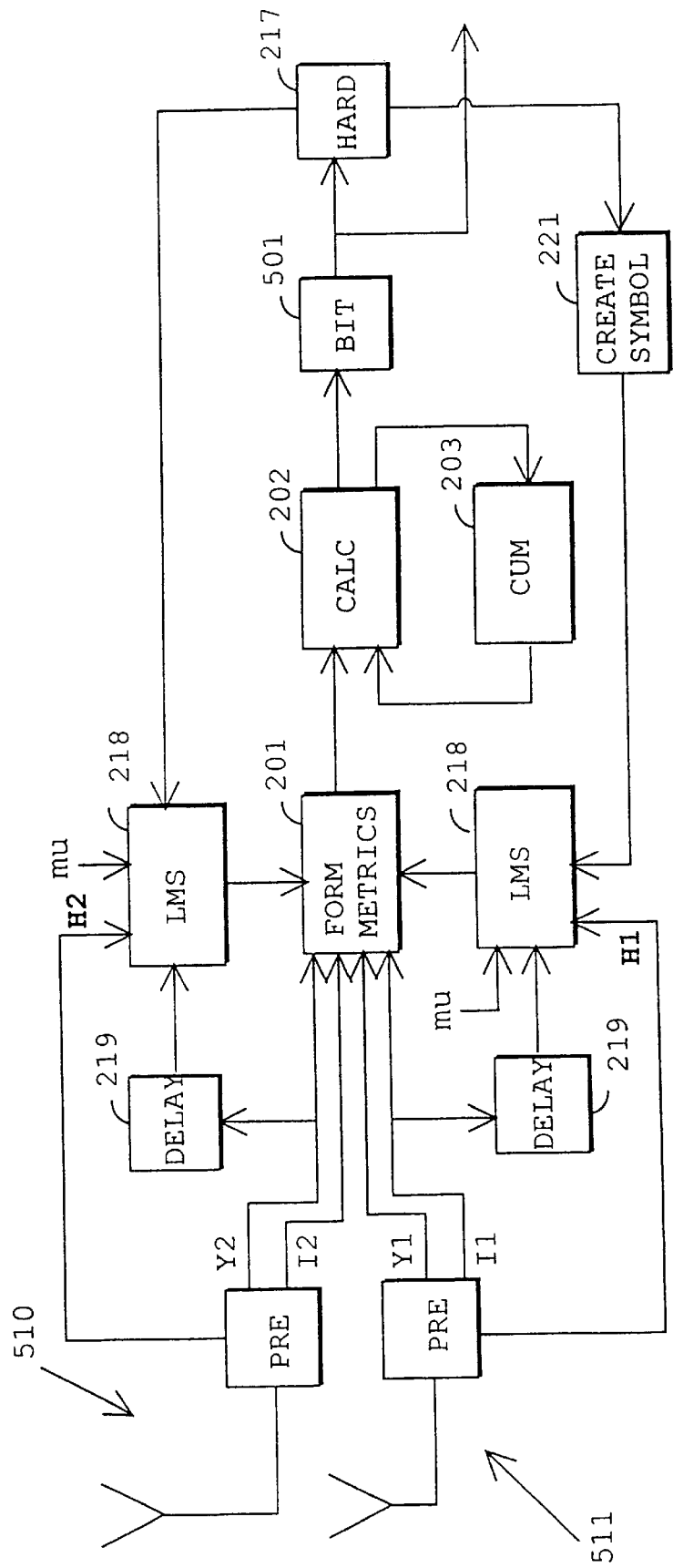
FIG. 5 illustrates a receiver comprising a plural number of branches.

The receiver can also comprise a plural number of diversity branches. This kind of a solution is illustrated by a block diagram in FIG. 5. The receiver comprises diversity branches 510 and 511, which comprise for instance an antenna and a signal preprocessing means, such as a mixer, analog-to-digital conversion means and means for generating signal samples, variance and an impulse response estimate. The receiver further comprises means 201 for forming the metric, means 202 for forming the transitions, means 203 for forming the cumulative transition metric, means 501, means 217 for making a hard decision, LSM means 218 and means 219 for generating a delay. Instead of the means 202 and 203, the means 302 and 303, which appeared in FIG. 3, can be used: The means 501 represent at least some of the means (304) 204 to 216. The receiver forms for each diversity branch a metric of its own and determines the bits by using for each branch separately. There are typically a plural number of the means 501, 217 and 221, their number advantageously corresponding to that of the bits in the symbol.

In the invention, received detection results are used for adaptively controlling the estimated impulse response. This can be carried out by minimizing the quadratic error. A typical Least Square (LSE) problem can be solved by implementing the means 218 by using a Kalman filter, an Extended Kalman Filter, a Recursive, Least Square (RLS) filter, a Least Mean Square (LMS) filter. An LMS means 218 advantageously performs the algorithm (10).

The magnitude of the channel interference required in the solution of the invention is calculated for instance followingly. A comparison signal YR is first generated, advantageously as a convolution, of the estimated channel impulse response and a predetermined sequence, such as a GSM system training sequence, and then an interference energy I is calculated, in a variance-type manner, from the comparison signal and the predetermined sequence of the signal received from the channel. By using the obtained comparison signal YR and the received signal Y, which is the received, predetermined sequence, a formula (15) is applied to calculate the variance-type result I from the signals.

$$I = \frac{\sum_i [\text{Re}(Y(i) - YR(i))^2 + \text{Im}(Y(i) - YR(i))^2]}{P}, \quad (15)$$

where P is any constant.

The solutions of the invention can be implemented, particularly as regards digital signal processing, for instance by using ASIC or VLSI circuits (Application-Specific Integrated Circuit, Very Large Scale Integration). The operations to be performed are advantageously carried out as programs based on microprocessor technology.

Although the invention is described above with reference to an example shown in the attached drawings, it is apparent that the invention is not restricted to it but can vary in many ways within the inventive idea disclosed in the attached claims.

What is claimed is:

1. A reception method in which received symbols are functions of bits, which are determined by means of temporally successive trellis levels A and B, which comprise a predetermined number of states, a transition from each of the states to a state at the next level B being performed on the bases of a received symbol, comprising:

forming, at more than one known state of the level B, a transition metric for a received symbol, the transition metric corresponding to a conditional probability and being used in the transition for moving from known states of the preceding level A to each said known state of the next level B, a state of a preceding level being determined as symbols in the transition metric, the symbols each having a predetermined number of symbol alternatives;

forming a cumulative transition metric by multiplying the transition metric by a cumulative metric relating to each known state of the preceding level A;

forming a cumulative metric relating to the states of the level B by summing cumulative transition metrics relating to the states of the level B over the symbol alternatives of a symbol, with a known location, determining a state of the preceding level A; and determining the bits of the received symbols separately for each bit of a symbol, irrespective of each other, by using the cumulative transition metrics.

2. The method of claim 1, wherein a log-likelihood decision of a bit is produced by:

summing such cumulative transition metrics of the states of the level B in which a bit with a predetermined location of the symbol with a known location correspond to 1, and by generating a logarithm of the sum;

summing such cumulative transition metrics of the states of the level B in which a bit with a predetermined location of the symbol with a know location corresponds to 0, and by generating a logarithm of the sum;

generating a difference of the logarithms of the sums of the cumulative transition metrics, the difference representing the log-likelihood decision of the bit.

3. The method of claim 1, wherein a bit probability of a bit corresponding to 1 is generated by:

summing such cumulative transition metrics of the states of the level B in which a bit with a predetermined location of the symbol with a known location corresponds to 1, and by generating a logarithm of the sum;

summing such cumulative transition metrics of the states of the level B in which a bit with a predetermined location of the symbol with a known location corresponds to 1 or 0, and by generating a logarithm of the sum;

generating a difference of the logarithms of the sums of the cumulative transition metrics, the difference representing the bit probability.

4. The method of claim 1, wherein a bit probability of a bit corresponding to 0 is generated by:

summing such cumulative transition metrics of the states of the level B in which a bit with a predetermined location of the symbol with a known location corresponds to 0, and by generating a logarithm of the sum;

summing such cumulative transition metrics of the states of the level B in which a bit with a predetermined location of the symbol with a known location corresponds to 1 or 0, and by generating a logarithm of the sum;

generating a difference of the logarithms of the sums of the cumulative transition metrics, the difference representing the bit probability.

5. A reception method in which received symbols are function of bits, which are determined by means of temporally successive trellis levels A and B, which comprise a predetermined number of states, a transition from each of the states to a state at the next level B being performed on the basis of a received symbol, comprising:

forming, at more than one known state of the level B, a transition metric for a received symbol, the transition metric corresponding to a conditional probability; and forming a logarithm of the transition metric, the transition metric being used in the transition for moving from known states of the preceding level A to each said known state of the next level B, a state of a preceding level being determined as symbols in the transition metric, the symbols each having a predetermined number of symbol alternatives;

forming a logarithmic-cumulative transition metric by summing a logarithmic transition metric to a logarithmic-cumulative metric relating to each known state of the preceding level A;

forming a exponential cumulative metric by using the logarithmic cumulative transition metric as an argument for an exponent function and by summing the exponential cumulative metrics over the symbol alternatives of a symbol, with a known location, determining a state of the preceding level A;

forming the logarithmic-cumulative metrics by generating a logarithm of the sum of the exponential-cumulative metrics; and determining the bits of the received symbols separately for each bit of a symbol, irrespective of each other, by using the logarithmic-cumulative transition metrics.

6. The method of claim 5, wherein a log-likelihood of a bit is generated by:

forming exponential cumulative transition metrics of the states of the level B;

summing such exponential cumulative transition metrics in which a bit with a predetermined location of the symbol with a known location corresponds to 1, and generating a logarithm of the sum, whereby a logarithm of the sums of the cumulative transition metrics is generated;

summing such exponential cumulative transition metrics of the states of the level B in which a bit with a predetermined location of the symbol with a known location corresponds to 0, and generating a logarithm of the sum, whereby a logarithm of the sums of the cumulative transition metrics is generated;

generating a difference of the logarithms of the sums of the cumulative transition metrics, the difference representing the log-likelihood of the bit.

7. The method of claim 5, wherein a bit probability of a bit corresponds to 1 is generated by:

forming exponential cumulative transition metrics of the states of the level B;

summing such exponential cumulative transition metrics in which a bit with a predetermined location of the symbol with a known location corresponds to 1, and generating a logarithm of the sum, whereby a logarithm of the sums of the cumulative transition metrics is generated;

summing such exponential cumulative transition metrics of the states of the level B in which a bit with a predetermined location of the symbol with a known location corresponds to 1 or 0, and generating a logarithm of the sum, whereby a logarithm of the sums of the cumulative transition metrics is generated;

generating a difference of the logarithms of the sums of said cumulative transition metrics, the difference representing the bit probability.

8. The method of claim 5, wherein a bit probability of a bit corresponding to 0 is generated by:

forming exponential cumulative transition metrics of the states of the level B;

summing such exponential cumulative transition metrics in which a bit with a predetermined location of the symbol with a known location corresponds to 0, and generating a logarithm of the sum; whereby a logarithm of the sums of the cumulative transition metrics is generated;

summing such exponential cumulative transition metrics of the states of the level B in which a bit with a predetermined location of the symbol with a known location corresponds to 1 or 0, and generating a logarithm of the sum, whereby a logarithm of the sums of the cumulative transition metrics is generated;

generating a difference of the logarithms of the sums of said cumulative transition metrics, the difference representing the bit probability.

9. The method of claim 1 or 5, wherein the impact of interference is taken into account when a transition metric is formed.

10. The method of claim 1 or 5, wherein when an impulse response estimate is available, received bits are used for making hard bit decisions, bit decisions are used for generating symbols, said symbols and the impulse response are used for generating reference symbols, the reference symbols are compared with corresponding received symbols by applying the least square sum method, and the result obtained by the comparison of the reference symbols and the received symbols is used for controlling the metric to be used in detection.

11. The method of claim 10, wherein in the least square sum method, a gradient of the impulse response estimate is observed and the metric is controlled by changing the impulse response estimate towards the change of the gradient.

12. The method according of claim 11, wherein the magnitude of the change of the impulse response estimate is controlled by weighting the change by a predetermined coefficient.

13. The method of claim 1 or 5, wherein when the receiver comprises a plural number of diversity branches, the symbol is determined and the bit decision is made for each of the diversity branches irrespective of each other.

14. A receiver which is arranged to determine the bits relating to a received symbol on the basis of temporally successive trellis levels A and B which comprise a predetermined number of states, a transition from each of the states to a state at the next level B being performed on the basis of a received symbol, wherein the receiver comprises:

means for forming, in more than more states of the states of the state B, a transition metric for a receive symbol, the transition metric corresponding to a conditional probability and to a transition from known states of the preceding level B to each said state of the next level B, a state of a preceding level being determined as symbols in the transition metric, each symbol having a predetermined number of symbol alternatives;

means for forming a cumulative transition metric by multiplying a transition metric by at a cumulative metric relating; to each known state of the preceding level A;

means for forming a cumulative metric by summing the cumulative transition metrics relating to the different states of the level B to the symbol alternative of the last symbol determining a state in the preceding level A; and the receiver is arranged to determined the bits of the received symbols separately for each bit of a symbol, irrespective of each other, by using the cumulative transition metrics formed in the means for forming a cumulative transition metric.

15. The receiver of claim 14, wherein for generating log-likelihood of a bit, the receiver comprises:

means for summing such cumulative transition metrics of the states of the level B in which a bit with a predetermined location of the symbol with a known location corresponds to 1, and means for generating; a logarithm of the sum;

means for summing such cumulative transition metrics of the states of the level B in which a bit with a predetermined location of the symbol with a known location corresponds to 0 and means for generating a logarithm of the sum;

means for generating a difference of the logarithms of the sums of the cumulative transition metrics, the difference representing the log-likelihood of the bit.

16. The receiver of claim 14, wherein for generating a bit probability of a bit corresponding to 1 the receiver comprises:

means for summing such cumulative transition metrics of the states of the level B in which a bit with a predetermined location if the symbol with a known location corresponds to 1, and means for generating a logarithm of the sum;

means for summing such cumulative transition metrics of the states of the level B in which a bit with a predetermined location of the symbol with a known location corresponds to 0, means for summing such cumulative transition metrics of the states of the level B in which a bit with a predetermined location of the symbol with a known location corresponds to 0 or 1 and means for generating a logarithm of the sum;

means for generating a difference of the logarithms generated in the means and means for generating a logarithm of the sum, the difference representing the bit probability.

17. The receiver of claim 14, wherein for generating a bit probability of a bit corresponding to 0 the receiver comprises:

means for summing such cumulative transition metrics of the states of the level B in which a bit with a predetermined location of the symbol with a known location corresponds to 1, and means for generating a logarithm of the sum;

means for summing such cumulative transition metrics of the states of the level B in which a bit with a predetermined location of the symbol with a known location corresponds to 0;

means for summing such cumulative transition metrics of the states of the level B in which a bit with a predetermined location of the symbol with a known location corresponds to 0 or 1 and means for generating a logarithm of the sum;

means for generating a difference of the logarithms generated in the means and means for generating a logarithm of the sum, the difference representing the bit probability.

18. A receiver which is arranged to determine the bits relating to a received symbol on the basis of temporally successive trellis levels A and B, which comprise a predetermined number of states, a transition from each of the states to a state at the next level B being performed on the basis of received symbol, wherein the receiver comprises:

means for forming, in more than more states of the state B, a transition metric for a received symbol, the transition metric corresponding to a conditional probability and to a transition from known states of the preceding level B to each said state of the next level B, as state of a preceding level being determined as symbols in the transition metric, each symbol having a predetermined number of symbol alternatives;

means for forming a logarithmic-cumulative transition metric by summing a logarithmic transition metric to a logarithmic-cumulative metric relating to each known state of the preceding level A;

means for forming a cumulative metric by summing the cumulative transition metrics relating to the different states of the level B over the symbol alternatives of the last symbol determining a state in the preceding level A and for forming a logarithmic-cumulative metric of the level B by generating a logarithm of the sum; and the receiver is arranged to generate the bits of the received symbols separately for each bit of a symbol, irrespective of each other, by using logarithmic-cumulative transition metrics.

19. The receiver of claim 18, wherein for generating a log-likelihood of a bit, the receiver comprises:

means for forming exponential cumulative transition metrics of the states of the level B;

means for summing such exponential cumulative transition metrics in which a bit with a predetermined location of the symbol with a known location corresponds to 1, and means for generating a logarithm of the sum, whereby a logarithm of the sums of the cumulative transition metrics is generated;

means for summing such exponential cumulative transition metrics of the states of the level B in which a bit with a predetermined location of the symbol with a known location corresponds to 0 and means for generating a logarithm of the sum, whereby is generated a logarithm of the sums of then cumulative transition metrics;

means for generating a difference of the logarithms of the sums of the cumulative transition metrics, the difference representing the log-likelihood of the bit.

20. The receive of claim 18, wherein for generating a bit probability of a bit corresponding to 1 the receiver comprises:

means for forming exponential cumulative transition metrics of the states of the level B;

means for summing such exponential cumulative transition metrics in which a bit with a predetermined location of the symbol with a known location correspond to 1, and means for generating a logarithm of the sum, whereby a logarithm of the sums of the cumulative transition metrics is generated;

means for summing such exponential cumulative transition metrics in which a bit with a predetermined location of the symbol with a known location corresponds to 0;

means for summing such exponential cumulative transition metrics of the states of the level B in which a bit with a predetermined location of the symbol with a known location corresponds to 1 and 0, and means for generating a logarithm of the sum, whereby a logarithm of the sums of the cumulative transition metrics is generated;

means for generating a difference of the logarithms generated in the means for generating a logarithm of the sum, the difference representing the bit probability.

21. The receiver of claim 18, wherein for generating a bit probability of a bit corresponding to 0 the receiver comprises:

means for forming exponential cumulative transition metrics of the states of the level B;

means for summing such exponential cumulative transition metrics in which a bit with a predetermined location of the symbol with a known location corresponds to 1, and means for generating a logarithm of the sum, whereby a logarithm of the sums of the cumulative transition metrics is generated;

means for summing such exponential cumulative transition metrics in which a bit with a predetermined location of the symbol with a known location corresponds to 0;

means for summing; such exponential cumulative transition metrics of the states of the level B in which a bit with a predetermined location of the symbol with a known location corresponds to 1 or 0, and means for generating a logarithm of the sum, whereby a logarithm of the sums of the cumulative transition metrics is generated;

means (211) for generating a difference of the logarithms generated in the means for generating a logarithm of the sum, the difference representing the bit probability.

22. The receiver of claim 14 or 18, wherein when the transition metric formed, the receiver is arranged to take into account the impact of interference.

23. The receiver of claim 14 or 18, wherein when an impulse response estimate is available, the receiver comprises:

means for using the received bits for making had bit decisions;

means for using said symbols and the impulse response for generating reference symbols and for comparing the reference symbols with a the corresponding received symbols by applying the leas square sum method, and for using the result obtained by the comparison of the reference symbols and the received symbols for controlling the means for forming a transition metric for a received symbol to change the metrics to be used in detection.

24. The receiver of claim 23, wherein the means for using said symbols are arranged to control the means for forming a transition metric for a received symbol in such a way that the impulse response estimate follows a gradient of the impulse response estimate.

25. The receiver of claim 24, wherein the means for using said symbols are arranged to control the magnitude of the change of the impulse response estimate by a predetermined coefficient.

26. The receiver of claim 14 or 18, wherein when the receiver comprises a plural number of diversity branches, the receiver is arranged to determine the bits of each diversity branch separately for each diversity branch.

* * * * *